(12) United States Patent
Koudymov et al.

(10) Patent No.: US 8,916,885 B2
(45) Date of Patent: Dec. 23, 2014

(54) SEMICONDUCTOR DEVICE WITH EFFICIENT CARRIER RECOMBINATION

(76) Inventors: Alexei Koudymov, Troy, NY (US); Christian Martin Wetzel, Troy, NY (US)

( * ) Notice: Subject to any disclaimer, the term of this patent is extended or adjusted under 35 U.S.C. 154(b) by 234 days.

(21) Appl. No.: 13/197,671

(22) Filed: Aug. 3, 2011

(65) Prior Publication Data
US 2012/0032210 A1 Feb. 9, 2012

Related U.S. Application Data

(60) Provisional application No. 61/370,172, filed on Aug. 3, 2010.

(51) Int. Cl.
*H01L 33/00* (2010.01)
*H01L 33/38* (2010.01)
*H01L 27/15* (2006.01)
*H01L 33/08* (2010.01)
*H01L 33/20* (2010.01)

(52) U.S. Cl.
CPC .......... *H01L 33/38* (2013.01); *H01L 33/08* (2013.01); *H01L 33/0016* (2013.01); *H01L 33/20* (2013.01)
USPC .............. 257/87; 257/79; 257/96; 257/189; 257/E33.016; 257/E33.034

(58) Field of Classification Search
CPC ..... H01L 29/778; H01L 29/775; H01L 33/00; H01L 33/06; H01L 33/26; H01L 27/15; H01L 33/002; H01L 31/143; H01L 31/162; H01S 5/00
USPC .......... 257/12, 13, 14, 27, 40, 79, 87, 89, 90, 257/94, 96, 97, 101, 102, 103, 187, 192, 257/E33.001, E33.007, E33.011, E33.016, 257/E33.023, E33.032, 59, 85, 99, 183, 257/189, 414, 431, E33.013, E33.035, 257/E33.034, E33.066
See application file for complete search history.

(56) References Cited

U.S. PATENT DOCUMENTS 7,732,826 B2 * 6/2010 Kamiyama et al. ............. 257/94
8,497,527 B2 * 7/2013 Koudymov et al. ........... 257/183

OTHER PUBLICATIONS

Kaestner et al. Low-dimensional light-emitting transistor with tunable recombination zone. Cond-Mat-Mes-Hall, 2006, pp. 1-12.*

* cited by examiner

*Primary Examiner* — Lynne Gurley
*Assistant Examiner* — Galina Yushina
(74) *Attorney, Agent, or Firm* — Alexey Kudymov (57) ABSTRACT

The present invention introduces the novel, improved design approach of the semiconductor devices that utilize the effect of carrier recombination, for example, to produce the electromagnetic radiation. The approach is based on the separate control over the injection of the electrons and holes into the active region of the device. As a result, better recombination efficiencies can be achieved, and the effect of the wavelength shift of the produced radiation can be eliminated. The devices according to the present invention outperform existing solid state light and electromagnetic radiation sources and can be used in any applications where solid state light sources are currently involved, as well as any applications future discovered.

10 Claims, 6 Drawing Sheets

SEMICONDUCTOR DEVICE WITH EFFICIENT CARRIER RECOMBINATION

CROSS-REFERENCE TO RELATED APPLICATION

This application claims the benefit of Provisional Patent Application Ser. No. 61/370,172, filed on Aug. 3, 2010 by present inventors.

FEDERALLY SPONSORED RESEARCH

Not Applicable.

SEQUENCE LISTING OR PROGRAM

Not Applicable.

FIELD OF THE INVENTION

The present invention relates to semiconductor devices. More particularly, the present invention relates to the devices utilizing the effect of carrier recombination to produce the useful output in the form of, for example, electromagnetic radiation.

BACKGROUND OF THE INVENTION

The semiconductor devices that utilize the effect of carrier recombination to produce the electromagnetic radiation are widely used in electronics and optoelectronics. Typically, to achieve efficient carrier recombination, the portions of semiconductor materials are brought in contact that provide two different general conductivity types, known as electron and hole conductivity types. Due to the mutual carrier penetration through the said contact caused by diffusion and/or drift in the externally applied electric field, the two types of carriers are simultaneously present in the region of the semiconductor device adjacent to the said contact, also referred to as active region, where they can recombine with each other under the emission of energy, in a form of either electromagnetic radiation (photon) or elastic crystalline lattice vibration (phonon). For a large class of devices, the said photon generation is the useful output.

In most of the cases, the photons are produced most effectively if the electron and hole interact and recombine as "free" carriers, resulting in so-called band-to-band recombination. This recombination leads to the generation of a photon with energy of (slightly higher than) the electronic bandgap of the portion of semiconductor comprising the said active region of the semiconductor device. This photon can be effectively absorbed by the semiconductor material having the same or lower bandgap as/than the said active region of the device. To prevent this absorption, efficient photon generating semiconductor devices are usually designed in such a way that the active region comprises the semiconductor material of the lowest bandgap all over the said device. The semiconductor device comprising the regions of different semiconductor materials is usually referred to as a heterostructure. Thus, effective photon generation device is usually a heterostructure device.

Exactly one electron and one hole contribute to a single act of recombination with generation of a photon. The probability of the recombination is proportional to both electron and hole concentrations at a given position within the active region of the semiconductor device. The steady-state concentration of the carriers during the device operation is achieved by detailed equilibrium of the electron and hole concentrations vanishing due to recombination and the electron and hole electric currents into and from the said active region.

The narrower bandgap semiconductor material usually has both conduction band and valence band within the energy range of the bandgap of the surrounding higher bandgap semiconductor material. Thus, the active region of a properly designed photon generating semiconductor device normally comprises one or several potential wells for both types of carriers. This helps maintain the carrier confinement within the said active region, increasing the photon generation efficiency of the device. However, the ability of the narrow band gap material comprising the active region to confine the carriers becomes weak with increasing carrier concentrations. This happens mainly because higher electric currents are needed to produce higher steady state carrier concentrations; these higher currents require higher electric fields in and near the active regions; carriers receive extra energy from the higher electric fields and obtain higher probability to drift into higher bandgap regions, thus leaving or passing through the active region. Typically, due to lower effective mass, the electrons gain more energy from the electric fields and are more likely to leave the active region. Due to current continuity, the number of the electrons and holes entering the active region in unit time is equal; as a result of the electrons having higher probability to escape, the symmetry of carrier concentration in the active region vanishes, and the efficiency of photon generation degrades. In addition, at high injection levels, the effect of a limited rate of radiative recombination through any centers involved in the desired radiative recombination may become relevant. This for example includes the considerations of a dipole matrix element reduced by the presence of an electric field within the quantum wells. It also may include the finite rate of excess carrier relaxation and thermalization processes required for carriers to reach the centers of desired radiative recombination.

In order to prevent the carrier escape from the active region, additional barrier regions are sometimes introduced adjacent to the said active region. Those barrier regions are usually designed to block the electron escape more effectively and, therefore, are usually positioned within the portion of the said semiconductor device having hole conductivity type. The pay-off of the barrier regions introduction is usually the degradation of the hole injection into the active region and increase in the electric potential drop across the device necessary to achieve the desired level of photon generation. In addition, as a result of the hole injection degradation, the active region becomes flooded with the electrons and, therefore, is turned into the electron (n-) conductivity type, at least for the conditions corresponding to the photon generation.

In spite of the barrier regions introduction, the carriers' leakage out of the active region still becomes severe at high carrier concentrations in the said active region. It happens mainly because the external electric potential applied to the device drops mostly across the less conductive regions of the device, which are in the case described above the barrier regions. At high enough applied electric potentials, the barriers become punched through for the electrons escape. This limits the efficiency of the photon generation by the semiconductor device at high currents and even leads to the saturation of the total number of photons that the said device is able to produce.

The present invention solves the problems of the electrons leakage from the active region of the photon generating semiconductor device and of balancing the electron and hole concentrations in the active region(s) of the said device by taking independent control of the electric potential applied between the active region of the device and the regions of the said device of different conductivity types.

SUMMARY OF THE INVENTION

According to the embodiment of the invention, the semiconductor device producing the electromagnetic radiation by the means of electric current carriers' recombination is provided. The device comprises: (a) at least two carrier supply regions, at least one region supplying electrons, and at least one region supplying holes; (b) at least one active region where the carrier recombination accompanied by photon generation is taking place; and (c) the means to control and/or enhance the (partial) current from at least one of the carrier supply regions to at least one of the active regions. Here, the term "partial" is used to specify that the said control means basically control of the flow of only carriers of one type, while of course, as the result of such control, the flow of the opposite type carriers may also change. The said control means are regulating the amount of the carriers of one type supplied to the active region with respect to the amount of the carriers of the other type supplied to the same region, as a result of application of control signal(s), including but not limited to applied electric potentials, electric currents, electromagnetic radiation, etc., with the aim of providing balanced concentrations of the carriers of opposite types in the active region for improved recombination efficiency.

It is preferred that the means for controlling the current of a single carrier type are located adjacent to the active region, between the said active region and the supply region of that said carrier type. It is further preferred that the said control means comprise a thin layer of the opposite conductivity type and electrical contact to the said thin layer of the opposite conductivity type. The thickness of the said thin layer is selected in such a way that the total carrier recombination rate in the said thin layer is a small fraction of the carrier recombination rate in the active region of the device for normal operation conditions. On the other hand, the thickness of the said thin layer is adjusted to allow the control signal spreading preferably uniformly over the entire area of the active region.

In an additional embodiment of the present invention, a set of smaller area devices is provided, the said devices being connected in parallel, to satisfy both the control uniformity requirement and total device active area requirement.

It is understood that, without limiting the scope of the presented invention, but in order to better understand the preferred embodiment, the pair of the carrier supply regions and the partial current control means can be referred to as a structure analogous to the Emitter and Base of a Bipolar Junction Transistor (BJT). In this case, the active region for the photon generation is placed within the collector of this imaginary BJT. Following this analogy, all the conventional considerations of improving the injection efficiency and reducing the base current are applicable, including the heterostructure-based type of emitter-base and/or base/collector junctions.

It is further understood that similar control means according to the present invention can be provided, in addition, to the carrier supply region of the opposite carrier type. In this case, the semiconductor device can be represented by two BJTs of opposite carrier types sharing their collector, where the said collector comprises the active region for the photon generation.

In the additional embodiment of the present invention, the thin conducting layer providing the partial current control means can be represented by a two-dimensional electron or hole gas (2DEG or 2DHG) formed, for example, at the heterointerface of two semiconductor materials with different bandgaps, or, for yet another example, near the portion of a material with variable composition that has a local minimum of the conduction band energy level, or a local maximum of the valence band energy level, respectively.

As it will be obvious to the person skilled in the art, the present invention provides the advantage of controlling the partial currents of different carrier types supplied to the active region of the carrier recombination semiconductor device independently. As a result, it becomes possible to compensate for any carrier leaks out of the active region and optimize the efficiency of useful carrier recombination. It also becomes possible to compensate for any carrier distribution asymmetry over a wide range of injection levels. Such a carrier distribution asymmetry may arise for example from a difference in carrier mobilities, diffusion coefficients, carrier lifetimes, diffusion lengths, parasitic recombination paths, and charge storage. By doing this, the artisan skilled in the art can, for example, avoid the drift of the actual position of the radiative recombination peak within the active region of the device. With respect to the light emitting diodes and laser diodes, for example, the present invention provides the possibility of the light generation efficiency enhancement in under a wide range of injection levels, thus solving the problem of the efficiency droop observed in many conventional light emitting devices.

An additional advantage of the present invention also discoverable by skilled artisan is the ability of the provided device to control the partial carrier currents without significant variation of the electric field in the active region of the device. The advantage is based on the fact that the electric field across the active region often leads to the carrier separation, which both reduces the recombination efficiency and leads to the change of the energy of the generated photons, which in turn results in the unwanted shift in the wavelength of the electromagnetic radiation generated. This said wavelength shift represents one of the challenges in many state-of-the-art light emitting and laser diodes.

These and other embodiments and advantages of the present invention will become readily apparent to those of ordinary skill in the art upon review of the disclosure and claims to follow.

BRIEF DESCRIPTION OF THE DRAWINGS

These and other objects of the present invention will become more clearly apparent from the following description of the embodiments taken in conjunction with the attached drawings, among which.

DETAILED DESCRIPTION OF THE EMBODIMENTS

Figure 1:
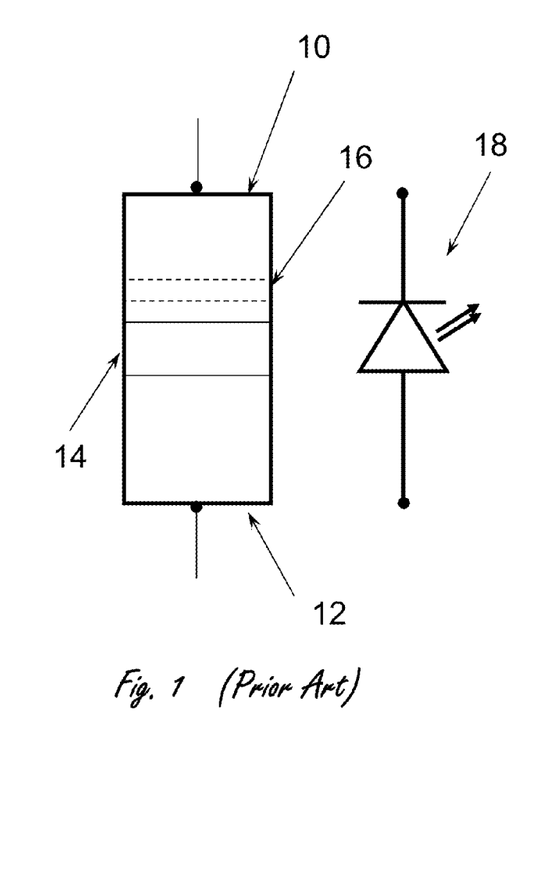
FIG. 1 provides schematic structure and circuit diagram symbol of a conventional Light Emitting Diode.

The conventional light emitting diode structure is illustrated in FIG. 1 of the attached drawings. The structure comprises the carrier supply layers of the electric current carriers of opposite types, namely electrons and holes, 10 and 12, which provide the corresponding carrier type injection into the active layer 14. Optional blocking layer(s) 16 can be introduced near the said active region 14 to limit the carriers' overflow and escape from the active region. The conventional circuit diagram symbol of the light emitting diode 18 is also presented. The typical position of the said blocking layer with respect to the active layer and terminals of opposite polarities, in accordance to the circuit diagram symbol 18 orientation, is depicted. The bold dots on the circuit diagram symbol 18 represent the external circuit connection points.

Figure 2:
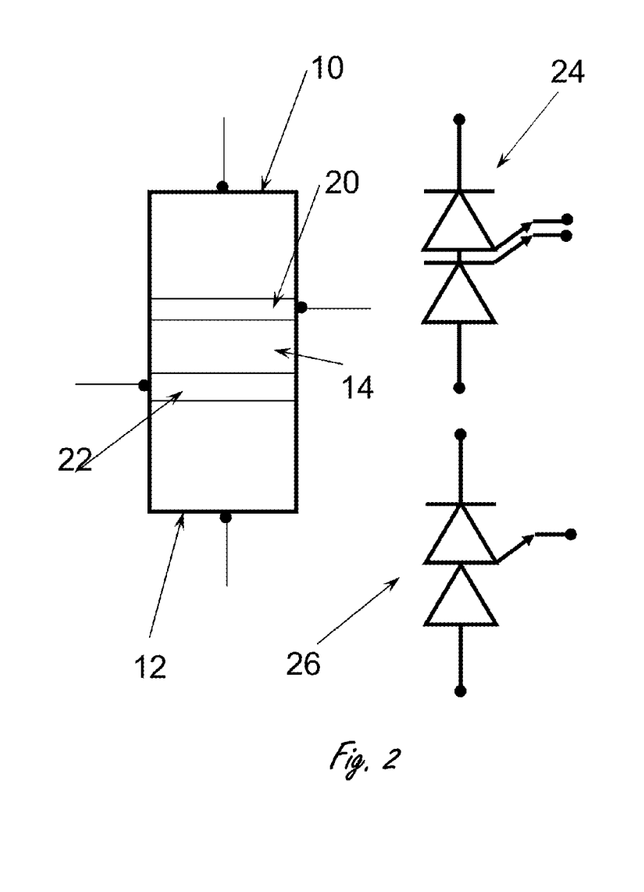
FIG. 2 provides a schematic structure and proposed circuit diagram symbol of the device according to the present invention.

In comparison to the conventional structure of FIG. 1, the device structure in accordance with one of the embodiments of the present invention is shown in FIG. 2. In addition to the elements of the structure of conventional Light Emitting Diode of FIG. 1, the means for the partial current control are introduced, the means comprising the layer 20 sandwiched between the carrier supply layer 10 and the active region 14 and controlling the injection of the carriers supplied by the said layer 10 and having attached a contact electrode, and the layer 22 sandwiched between the carrier supply layer 12 and the active region 14 and controlling the injection of the carriers supplied by the said layer 12 and also having attached a contact electrode. The circuit diagram symbol 24 proposed for use with respect to the device as described herein is presented. The simplified circuit diagram symbol 26 is also provided. The bold dots on the circuit diagram symbols 24 and 26 represent the external circuit connection points.

The suggested circuit diagram symbols 24 and 26 reflect the fact that the pairs of the carrier supply layer and corresponding means for partial control 10-20 and 12-22 form structures having general properties of semiconductor diodes.

Figure 3:
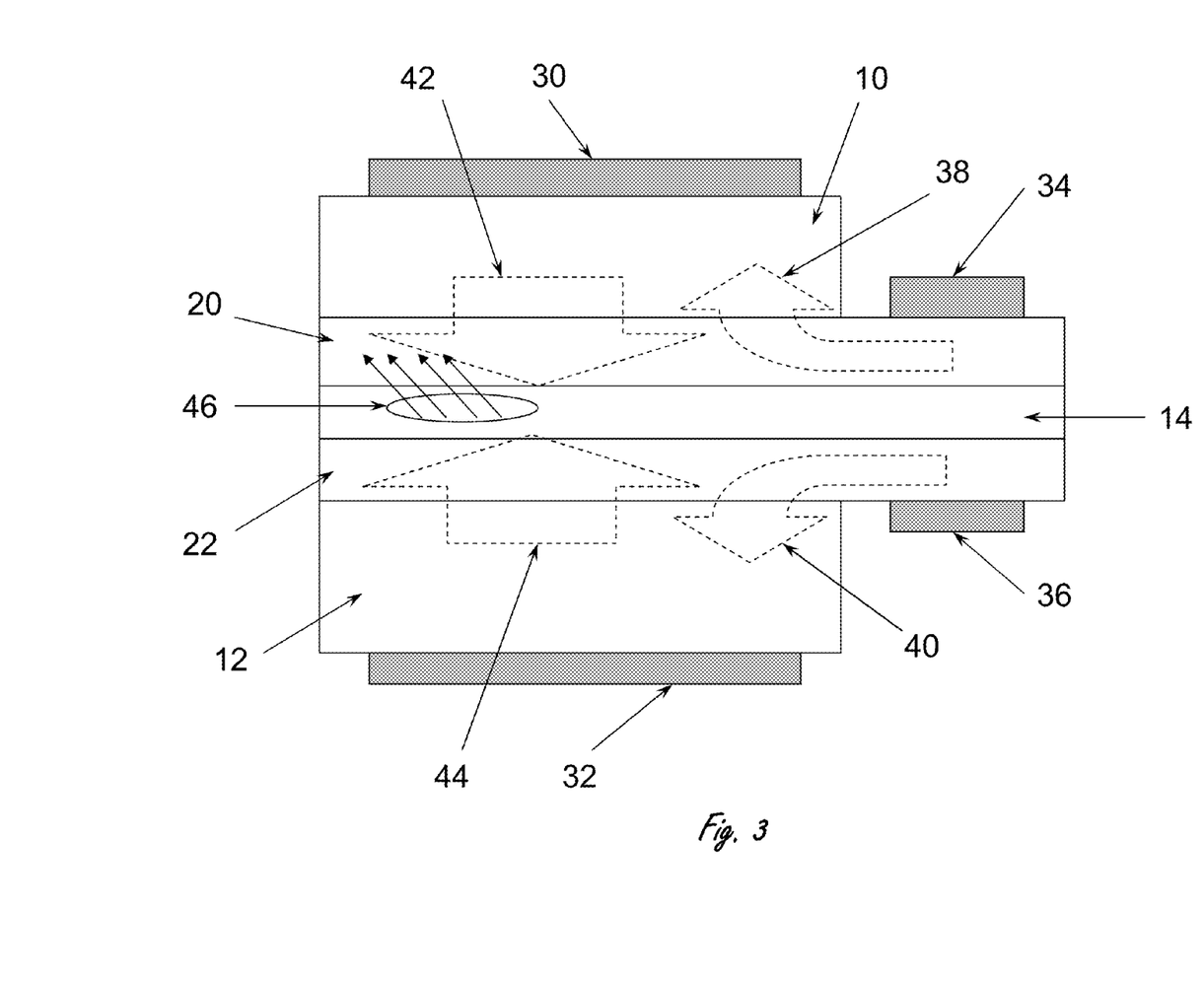
FIG. 3 illustrates the principle of independent control over the carrier injection of the carriers of different types into the active region of a semiconductor device, according to one of the embodiments of the present invention.

In particular, the device structure as presented in FIG. 2 can be practically implemented as illustrated in more detail in FIG. 3. According to FIG. 3, the active layer 14 of a semiconductor device is placed between the two structures formed by the pairs of semiconductor layers 10-20 and 12-22. The pairs of semiconductor layers 10-20 and 12-22 are each formed by two semiconductors of opposite general conductivity types, for example, layer 10 comprising p-type of conductivity and layer 20 comprising n-type of conductivity, and respectively, layer 12 comprising n-type of conductivity, and layer 22 comprising p-type of conductivity. It is understood that without change in purpose and properties of the structure of FIG. 3, the conductivity types of the said layers may be inverted all together.

As a result of such arrangement, the carriers are supplied to the active region of a semiconductor device of FIG. 3 through the two p-n junctions formed by the pairs of semiconductor layers 10-20 and 12-22. The electric potentials across the p-n junctions are independently controlled by the electric potentials applied to the pairs of electrical terminals 30-34 and 32-36. At the same time, the electric potentials drop across the active region 14 is controlled by the potential difference (voltage) applied between the electrical terminals 34 and 36.

According to the properties of the p-n junction, the electrical current is flowing through the junction between layers 10 and 20 in response to the electric potential applied between electrical terminals 30 and 34. The width of the layer 20 and impurity doping levels of the said layer 20 and layer 10 are selected such that most part of the flux 42 of the carriers corresponding to the conductivity type of the layer 10 injected through the said p-n junction flow through the layer 20 into the active region 14. At the same time the flux 38 of the carriers of the opposite type injected through the p-n junction recombine within layer 10 or get removed from the structure through the electrical terminal 30. The electric power associated with the flux 38, therefore, comprises the loss during the device operation. Obviously, this loss can be reasonably minimized by the selection of the doping levels in semiconductor layers 10 and 20 or other means discoverable by skilled artisan, such as additional layers inclusion and/or selective area treatments.

As a result of such arrangement, the electric potential applied between the electrical terminals 30 and 34 controls the injection of the carriers of the conductivity type corresponding to layer 10 into the active region 14 of the structure.

Similarly, the electrical current is flowing through the junction between layers 12 and 22 in response to the electric potential applied between electrical terminals 32 and 36. The width of the layer 22 and impurity doping levels of the said layer 22 and layer 12 are selected such that most part of the flux 44 of the carriers corresponding to the conductivity type of the layer 12 injected through the said p-n junction flow through the layer 22 into the active region 14. At the same time the flux 40 of the carriers of the opposite type injected through the p-n junction recombine within layer 12 or get removed from the structure through the electrical terminal 32. The electric power associated with the flux 40, therefore, comprises the loss during the device operation. Obviously, this loss can be reasonably minimized by the selection of the doping levels in semiconductor layers 12 and 22.

As a result of such arrangement, the electric potentials applied between the electrical terminals 32 and 36 controls the injection of the carriers of the conductivity type corresponding to layer 12 into the active region 14 of the structure.

The mixing of the fluxes 42 and 44 in the active region 14 results in the recombination of the carriers comprised by these fluxes. As a result, the electromagnetic radiation 46 is generated in the active region. The said electromagnetic radiation can be further extracted from the structure and/or returned back into the active region for resonant amplification by standard means.

Figure 4:
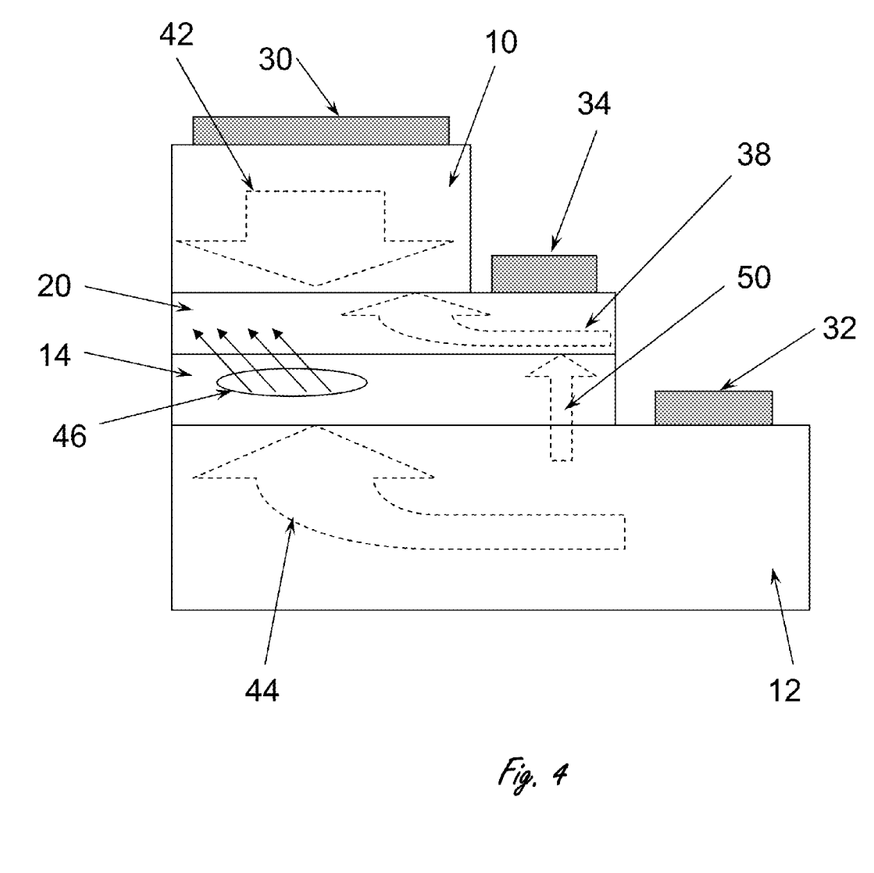
FIG. 4 illustrates the principle of independent control over the carrier injection of the carriers of one type into the active region of a semiconductor device, according to another embodiment of the present invention.

Another embodiment of the present invention provides the simplified structure depicted in FIG. 4. In FIG. 4, only one of the carrier supply layers, namely 10, is provided with the injection control means 20. Similar to the description above, the electric potential applied between the electrical terminals 30 and 34 controls the injection of the carriers of the conductivity type corresponding to layer 10 into the active region 14 of the structure. The increase of the electric potential drop between electrical terminals 32 and 34 results in parasitic current flow 50. Therefore, the range of effective performance of this additional embodiment is limited to the low injection levels from the carrier supply layer 12. However, the fabrication of the device according to the embodiment illustrated by FIG. 4 is significantly simplified as compared to the one of FIG. 3. As a result, the simplified structure of FIG. 4 may be preferably implemented for the applications where only low to moderate levels of output electromagnetic radiation densities are required.

As it was mentioned above, in practical cases some of the semiconductor layers 20 and/or 22 comprising the carrier injection control means can be replaced with two-dimensional conducting layers formed at semiconductor heterointerfaces. The structure and performance of such device is described below in even more detail with respect to our working example.

Example

A semiconductor device as described in this example was fabricated to illustrate but not limit the scope of the present invention. The schematic structure of the exemplary device is given in FIG. 5. The improved performance of the exemplary semiconductor device over the conventionally designed device fabricated from the same semiconductor wafer will be clear to the artisan skilled in the art from the data presented in FIGS. 6 and 7.

The semiconductor device intended to produce the electromagnetic radiation in the green region of visible spectra was fabricated using the Gallium Nitride material system. For the purpose of the present invention, by Gallium Nitride material system we understand Gallium Nitride, Aluminum Nitride, Indium Nitride and their compounds.

The growth of the semiconductor material was performed using a commercial Metal Organic Vapor Phase Deposition (MOVPE) machine over the sapphire substrate 80. The growth was performed in polar crystallographic direction (so-called c-axis) of the Gallium Nitride material. First, transitional nucleation layer was deposited on the epitaxy-grade sapphire surface followed by the deposition of about 3 micrometers of intentionally n-type doped Gallium Nitride layer. Second, the active region was formed over the said n-type layer comprising the Multiple Quantum Well (MQW) structure. The MQW structure had a conventional design recognized by skilled artisan to produce electromagnetic radiation in the green spectral range (525-540 nanometers). The structure comprised five layers of Indium Gallium Nitride with Indium Nitride composition of about 20% and thicknesses of about 3 nm, separated by the layers of Gallium Nitride of the thicknesses of about 10 nm.

The electron blocking layer was deposited on top of the active layer comprising the Aluminum Gallium Nitride layer of the thickness of approximately 35 nm, with Aluminum Nitride composition of about 15%. Here, the thickness of the Electron Blocking Layer (EBL) was slightly increased as compared to the conventional structure in order to produce the conditions for the two-dimensional electron gas (2DEG) formation at the active layer/EBL interface, as will be discussed below.

The structure was finalized by forming the p-type doped access layer on top of EBL, comprising Gallium Nitride layer of the thickness of approximately 450 nm. The concentration of the magnesium dopant which provides the p-type conductivity was high enough to allow the formation of the Nickel-Gold ohmic contact to it on the top of the structure.

Conventional green Light Emitting Diode (LED) was formed on the part of the semiconductor wafer described above, separated from the semiconductor wafer by cleavage. In order to fabricate conventional LED, the following processing steps were performed. First, the mesa structure was formed using the Inductively Coupled Plasma (ICP) etching using the mixture of Chlorine and Argon gases. The etch depth was about 1 micrometer to enable the access to the bottom n-layer of the structure. The mesa structures had nearly square layout with the area of about 350 by 350 square micrometers. Second, the metallization stack was formed by standard steps of photolithography, electron beam deposition, metal lift-off and rapid thermal anneal in the etched region of the structure around the mesa structures to provide the electrical terminal connected to the said n-type Gallium Nitride layer. Third, the metallization stack was formed by standard steps of photolithography, electron beam deposition, metal lift-off and rapid thermal anneal on top of the mesa structure to provide the electrical terminal connected to the p-type Gallium Nitride layer on top of the structure. The fabrication process was finalized by formation of thick metal contact pads electrically connected to the said electrical terminals respectively.

The green LED as provided by one of the embodiments of the present invention was formed on another part of the semiconductor wafer described above, separated from the semiconductor wafer by cleavage. First, the mesa structure was formed using the ICP etching using the mixture of Chlorine, Boron Trichloride ($BCl_3$), Sulfur Hexafluoride ($SF_6$) and Argon gases. This combination of gases is known to provide the selective etch rate that is much higher for the Gallium Nitride as compared to Aluminum Gallium Nitride (see for example, D. Buttari, A. Chini, A. Chakraborty, L. McCarthy, H. Xing, T. Palacios, L. Shen, S. Keller, and U. K. Mishra, "Selective dry etching of GaN over AlGaN in $BCl_3/SF_6$ mixtures", in Abstracts to IEEE Lester Eastman Conference on High Performance Devices, Cornell University, Ithaca, N.Y., 2004). The etch time was selected such that only the top p-type Gallium Nitride layer was removed from the regions surrounding the mesa structures. The rest of the fabrication process was identical to the conventional LED and performed simultaneously, including the steps of the n-type electrical terminal metallization stack formation, p-type electrical terminal metallization stack formation and the probe pads formation. Referring to the FIG. 5, in addition, separate remote contact 32 to the bottom n-layer of Gallium Nitride was formed by removing the top layers of the semiconductor material mechanically using the diamond scriber and applying soft Indium metal spot to the scratched area.

Figure 5:
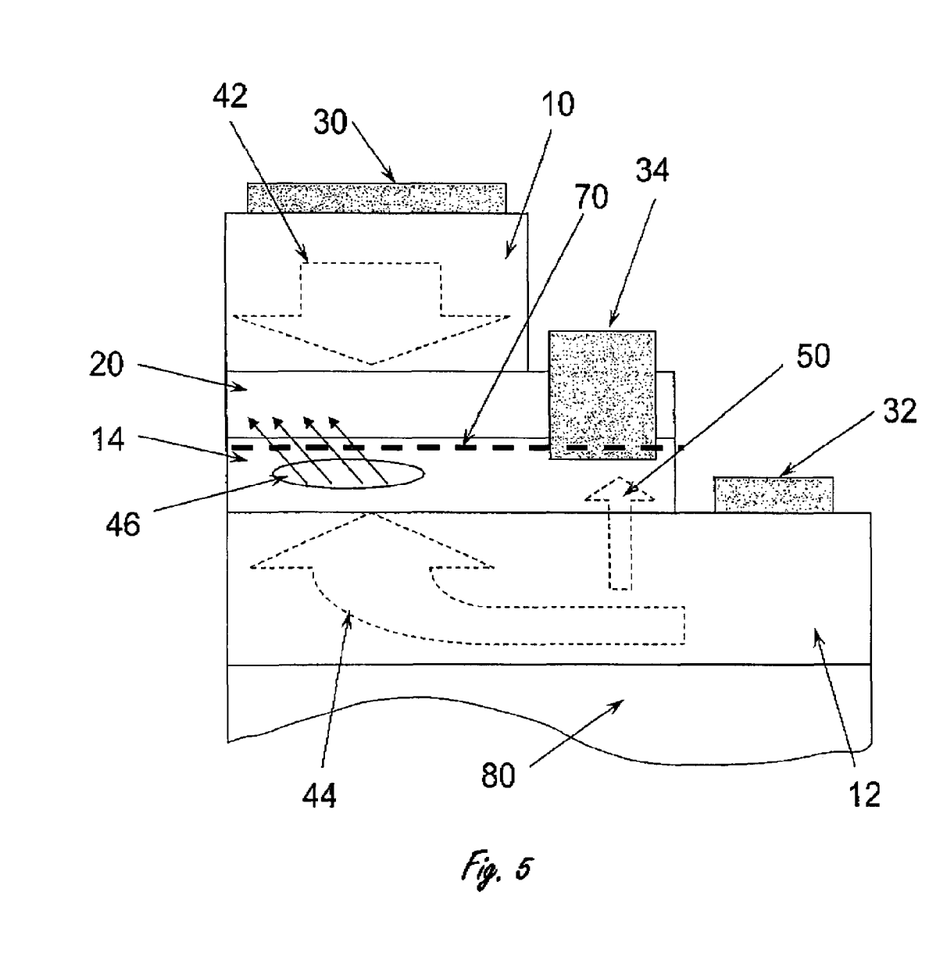
FIG. 5 illustrates the principle of independent control over the carrier injection of the carriers of one type into the active region of a semiconductor device, according to yet another embodiment of the present invention.

The resulting structure of the exemplary LED according to one of the embodiments of the present invention is depicted in FIG. 5. An important element of the structure is the 2DEG 70 formed at the boundary between the active layer and the EBL of the structure. The formation of the 2DEG 70 for given Aluminum composition and thickness of the EBL deposited over the layer of the MOCVD grown Gallium Nitride (Ga-face, or growth in the direction of positive c-axis) is theoretically predicted, for example, by (O. Ambacher, J. Smart, J. R. Shealy, N. G. Weimann, K. Chu, M. Murphy, W. J. Schaff, L. F. Eastman, R. Dimitrov, L. Wittmer, and M. Stutzmann, W. Rieger and J. Hilsenbeck, "Journ. Appl. Phys., V. 85, p. 3222, 1999). The theory developed in the paper by Ambacher et al referenced above is confirmed experimentally by many research groups.

The formation of the electrical terminal 34 to the n-layer of the structure as described above in the case of the presence of the Aluminum Gallium Nitride layer 20 and the 2DEG 70 at the interface between the said Aluminum Gallium Nitride layer 20 and Gallium Nitride material comprised in the layer just below it is identical to the standard process of formation of electrical contacts to the 2DEG used, for example, in fabrication of conventional Heterostructure Field Effect Transistors (see for example: M. Asif Khan, G. Simin, J.

Yang, J. Zhang, A. Koudymov, M. S. Shur, R. Gaska, X. Hu, and A. Tarakji, "Insulating Gate III-N Heterostructure Field-Effect Transistors for High Power Microwave and Switching Applications", IEEE Transactions on Microwave Theory and Techniques, V. 51, pp. 624-633, 2003). Therefore, the electrical terminal 34 provides electrical connection directly to the 2DEG 70. Since in the structure of FIG. 5 described above, the 2DEG 70 is only separated from the bottom n-type Gallium Nitride layer 12 by the energy barriers existing in the active layer 14 of the structure that do not provide electrical isolation, it can be speculated that the terminal 34 also provides electrical connection to the said bottom n-type Gallium Nitride layer 12. It is therefore apparent that by forming the electrical terminal 34, the application of the electric potential across the active region of an LED of FIG. 5 is prevented. As a result, only two components of the electron current between the active region and the bottom n-type Gallium Nitride layer are possible: the diffusion component due to the difference in the electron concentrations between the said two regions and drift component in the built-in electric field of the active region structure. The said electric field may have, among the others, the polarization and piezoelectric nature. Therefore, the drift electron current into the active region is practically independent on the electric potential applied between electrical terminals 30 and 34, preventing the electron flooding of the active area at high injection levels and related LED efficiency degradation. At the same time, the hole drift current through the EBL is fully controlled by the electric potential applied between the said pair of electrical terminals 30 and 34.

Figure 6:
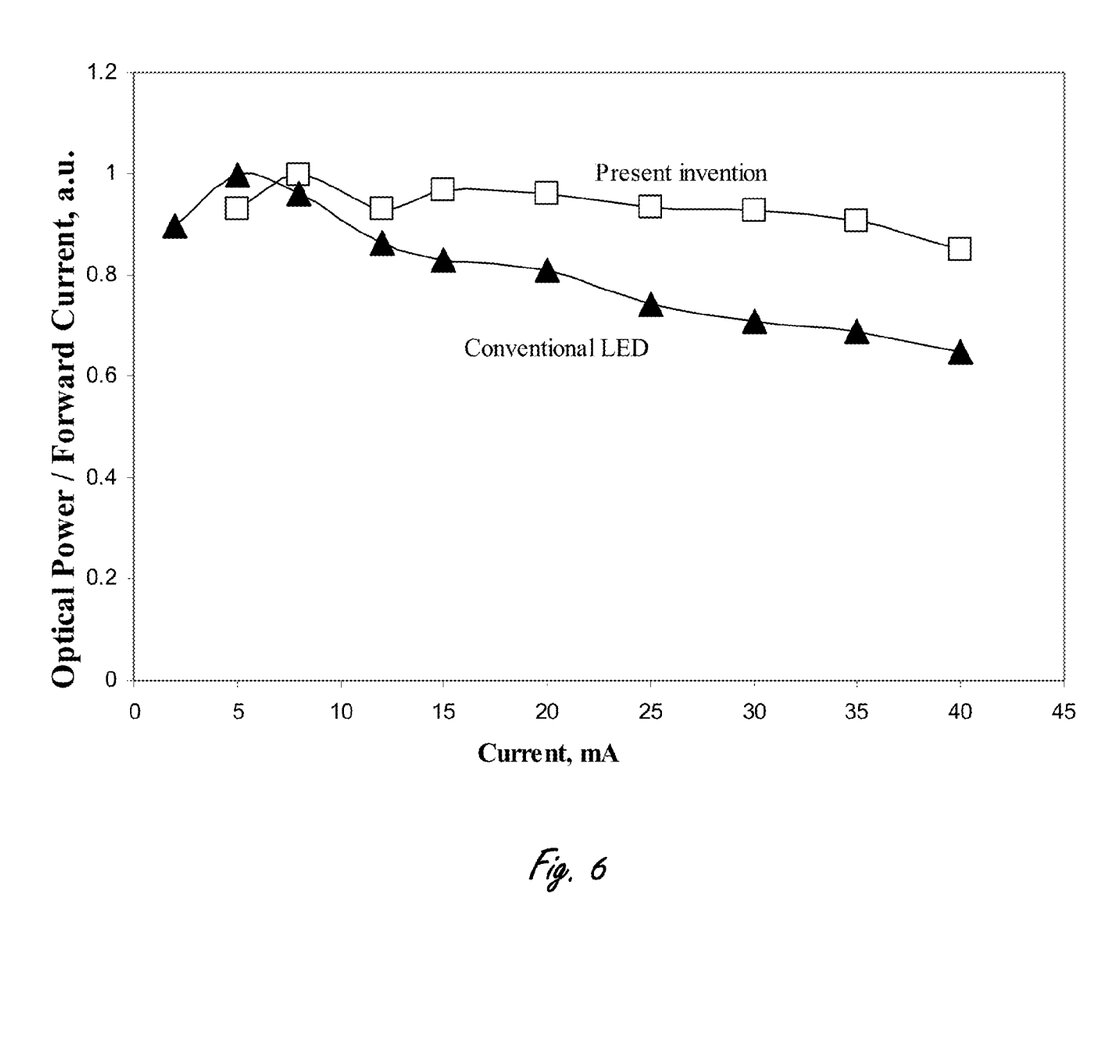
FIG. 6 provides the comparison of the light generation efficiency linearity of the conventional light emitting diode and light emitting diode according to the present invention fabricated from the same piece of semiconductor material.

FIG. 6 provides the comparison of the ratios of the optical power produced by a semiconductor device to the electrical current flowing through it, for the LED depicted in FIG. 5 according to one of the embodiments of the current invention and the conventional LED formed on the same wafer as described above. The measurements were performed on-wafer, and the produced light was collected by the integrating sphere from the bottom side of the wafer. The ratios characterize the external quantum efficiency of the LEDs. For convenience, the ratios in FIG. 6 are normalized to their maximum values. From FIG. 6, the ratio of the output optical power to the electric current and corresponding external quantum efficiency are constantly degrading for the conventional LED with the increase of the electrical current. In contrast, an LED according to one of the embodiments of the present invention demonstrates the ratio of the output optical power to the electric current and corresponding external quantum efficiency nearly independent on the driving current level within the same range of the electrical currents. This linearity improvement is directly related to the absence of the electron flooding of the active region at high carrier injection levels, as described above.

Figure 7:
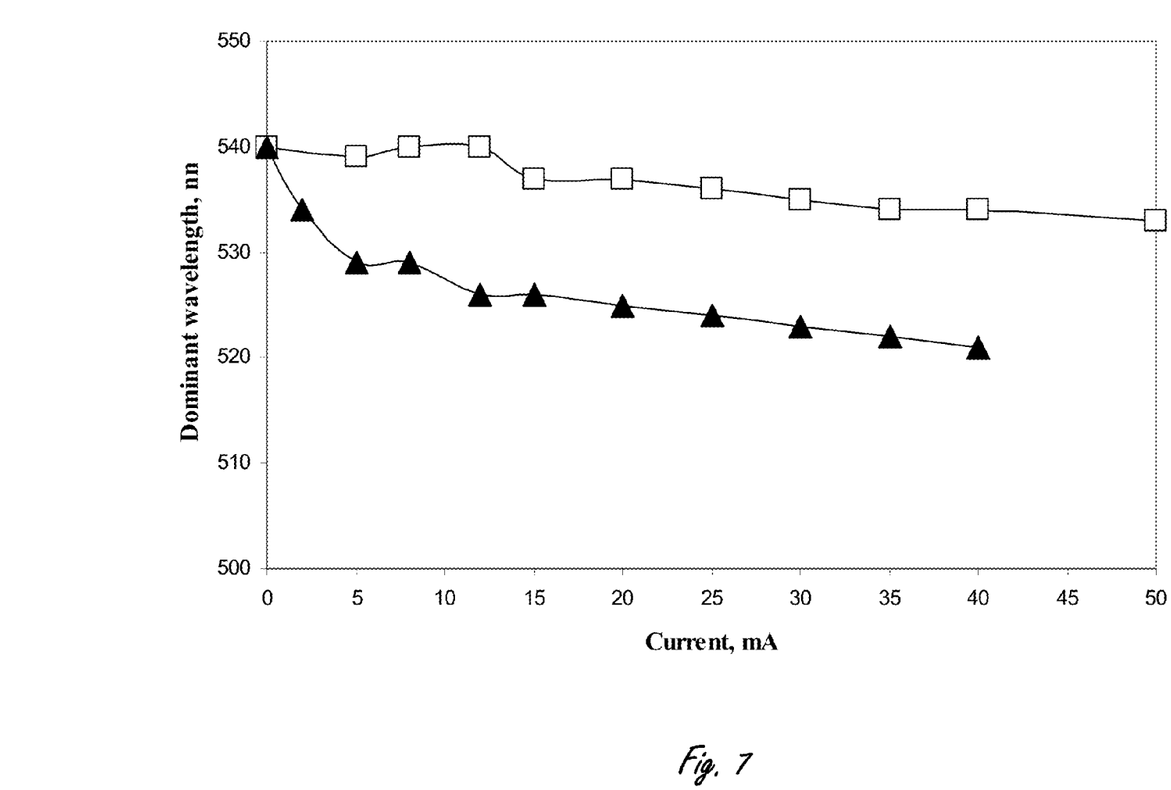
FIG. 7 provides the comparison of the wavelength shift of the generated light as a function of the total generated light power of the conventional light emitting diode and light emitting diode according to the present invention fabricated from the same piece of semiconductor material.

In FIG. 7, another advantage of the LED fabricated in accordance with one of the embodiments of the present invention as illustrated by FIG. 5 as compared to a conventional LED fabricated from the same wafer is presented. The dependencies of the dominant wavelength on the driving current are provided, showing strong wavelength shift of the radiation produced by conventional LED towards blue range of the spectra. Such a shift is typical for all Gallium Nitride based green and blue LEDs fabricated over polar-grown semiconductor structures. As a result, an LED that is producing the true green electromagnetic radiation at low intensities (low driving currents), turns to produce bluish-green to cyan radiation at high intensities (high driving currents). In contrast, an LED of the present invention demonstrates much less wavelength shift over the same range of the driving currents remaining true green at low and high radiation intensities.

Finally it has to be mentioned that the radiation intensities produced by both devices compared above saturate at high injection levels due to the combination of electrical and thermal effects. The saturation levels for both devices are nearly the same, so that the total optical powers available from both devices are nearly equal. At the same time, the nearly two-fold increase in output optical power was observed for the LED according to the present invention during pulse operation for the pulse durations detectable by human eye (several hundreds of milliseconds). No such optical power increase was detected for conventional LED fabricated from the same wafer. The observed effect suggests that the mechanisms limiting the available optical power are different for the two devices.

The LED device of FIG. 5 was also tested for the light emitting performance using the three terminal connection scheme, where all three electrical terminals 30, 32 and 34 can be biased independently. No difference in performance was observed by applying the bias between terminals 32 and 34, except for extra electric current flowing between these two terminals was observed. This observation confirms that the bias applied between the terminals 32 and 34 results mostly in the parasitic current 50 comprising only one type of carriers, namely electrons, and therefore not contributing to the light generation. It is further suggested that, in case additional control means such as p-n junction are applied to the electron supply of the device as per one of the embodiments of the present invention previously described, more effective control over the electron injection and further improvement of the maximum available optical power can be achieved.

What is claimed is:

1. A semiconductor device producing electromagnetic radiation using the effect of carriers recombination, the device comprising:
   (a) at least two carrier supply regions, wherein at least one region supplying electrons, and at least one region supplying holes;
   (b) at least one active layer, in the entirety of which, with an exception to the areas occupied by external electric contacts and technological gaps adjacent to said contacts, the carriers recombination accompanied by photon generation is taking place; and
   (c) means to control and/or enhance the (partial) electrical current from at least one of the carrier supply regions to at least one active layer, said means comprising an electrically conducting sheet layer sandwiched between the active layer and the at least one of the carrier supply regions, and external electric contact to said electrically conducting sheet layer.

2. The semiconductor device of claim 1 where at least one of the means to control and/or enhance the electrical current from at least one of the carrier supply regions comprises a p-n junction.

3. The semiconductor device of claim 1 where at least one of the means to control and/or enhance the electrical current from at least one of the carrier supply regions comprises a heterojunction.

4. The semiconductor device of claim 1 where said electrically conducting sheet layer comprises a two-dimensional electron or hole gas region.

5. A light emitting device comprising:
   (a) a substrate;
   (b) an n-doped layer of a semiconductor material having a bandgap deposited over said substrate;

(c) an active layer of a semiconductor material comprising inclusions of (a) different, semiconductor materials having a bandgap that is lower than the bandgap of said n-doped layer, said inclusions having a dimension in at least one direction of several nanometers range, capable to create a quantum well in said direction, said active layer being deposited on top of said n-doped layer;

(d) an electron blocking layer deposited on top of said active layer, said electron blocking layer comprising a semiconductor material having a bandgap higher than the bandgap of said n-doped layer;

(e) a p-doped layer of a semiconductor material having a bandgap deposited over said electron blocking layer;

(f) a 2-dimensional electron gas created at the interface between said active layer and said electron blocking layer;

(g) an external contact providing electric connection to said 2-dimensional electron gas.

6. The semiconductor device of claim 5 where said n-doping layer of a semiconductor material comprises Gallium Nitride.

7. The semiconductor device of claim 6 where said 2-dimensional electron gas is created at said interface between said active layer and said electron blocking layer without application of an external electric bias, due to selection of the bandgap, polarization and doping of the electron blocking layer material.

8. The semiconductor device of claim 7 where said electron blocking layer material comprises Aluminum compound.

9. The semiconductor device of claim 7 where said inclusions of the smaller bandgap material comprised in the active region comprise Indium compound.

10. The semiconductor device of one of the claims 5-9 that emits light of the wavelength in the range of 525 to 540 nm.

* * * * *